(12) United States Patent
Sugiyama et al.

(10) Patent No.: US 11,367,170 B2
(45) Date of Patent: Jun. 21, 2022

(54) MANUFACTURING MANAGEMENT SYSTEM FOR COMPONENT MOUNTING LINE

(71) Applicant: FUJI CORPORATION, Chiryu (JP)

(72) Inventors: Kenji Sugiyama, Anjo (JP); Shuichiro Kito, Toyota (JP); Hiroshi Oike, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 625 days.

(21) Appl. No.: 16/461,633

(22) PCT Filed: Dec. 1, 2016

(86) PCT No.: PCT/JP2016/085755
§ 371 (c)(1),
(2) Date: May 16, 2019

(87) PCT Pub. No.: WO2018/100717
PCT Pub. Date: Jun. 7, 2018

(65) Prior Publication Data
US 2021/0233226 A1 Jul. 29, 2021

(51) Int. Cl.
*H05K 13/04* (2006.01)
*G06T 7/00* (2017.01)
(Continued)

(52) U.S. Cl.
CPC ...... *G06T 7/0004* (2013.01); *G05B 19/41875* (2013.01); *H05K 13/0409* (2018.08);
(Continued)

(58) Field of Classification Search
CPC ........ G06T 7/0004; G06T 2207/30141; H05K 13/0409; H05K 13/083; H05K 13/0813;
(Continued)

(56) References Cited

U.S. PATENT DOCUMENTS

| 5,038,380 A * | 8/1991 | Morimoto | G06T 7/73 382/288 |
|---|---|---|---|
| 2004/0208353 A1 * | 10/2004 | Murakami | G01N 21/956 382/145 |
| 2005/0190956 A1 * | 9/2005 | Fujii | H05K 13/0815 382/141 |
| 2005/0250223 A1 * | 11/2005 | Kano | H05K 13/0417 438/1 |

(Continued)

FOREIGN PATENT DOCUMENTS

| EP | 2 916 188 A1 | 9/2015 |
|---|---|---|
| JP | 2006-339244 A | 12/2006 |

(Continued)

OTHER PUBLICATIONS

International Search Report dated Mar. 7, 2017 in PCT/JP2016/085755 filed on Dec. 1, 2016.

*Primary Examiner* — Sheela C Chawan
(74) *Attorney, Agent, or Firm* — Oblon, McClelland, Maier & Neustadt, L.L.P.

(57) ABSTRACT

A component mounter images suction states of components picked up by a suction nozzle, processes images of the suction states of the components to recognize the suction state of the component, and stores the images in a storage device with linking production information related to the components. An inspection machine images a mounted state of each component on a board, processes an image of mounted state of each component to recognize the mounted state of each component, and inspects whether a mounting error occurred for each component based on the recognition result. The inspection machine determines that a mounting error occurred for any of the components the image of the mounted state of the component for which a mounting error was determined to have occurred and a searched image of the suction state of the component are displayed on the display monitor in a comparative manner.

14 Claims, 6 Drawing Sheets

(51) Int. Cl.
*H05K 13/08* (2006.01)
*G05B 19/418* (2006.01)

(52) U.S. Cl.
CPC ....... *H05K 13/083* (2018.08); *H05K 13/0813* (2018.08); *G05B 2219/32214* (2013.01); *G05B 2219/45026* (2013.01); *G06T 2207/30141* (2013.01)

(58) Field of Classification Search
CPC .......... H05K 13/0815; G05B 19/41875; G05B 2219/32214; G05B 2219/45026; G05B 19/418
USPC ....... 382/100, 141, 147, 149, 151, 214, 281, 382/216, 305; 348/82, 86, 87, 92
See application file for complete search history.

(56) References Cited

U.S. PATENT DOCUMENTS

| | | | |
|---|---|---|---|
| 2007/0058853 A1 | 3/2007 | Minakata et al. | |
| 2011/0023296 A1* | 2/2011 | Muraoka | H01L 24/75 29/832 |
| 2015/0286202 A1* | 10/2015 | Amano | G05B 11/011 700/110 |
| 2017/0325370 A1* | 11/2017 | Nozawa | H05K 13/0413 |

FOREIGN PATENT DOCUMENTS

| | | |
|---|---|---|
| JP | 2007-81080 A | 3/2007 |
| JP | 2011-151087 A | 8/2011 |
| JP | 2012-99792 A | 5/2012 |
| JP | 2014-110335 A | 6/2014 |
| WO | WO 2014/068664 A1 | 5/2014 |
| WO | WO 2016/117016 A1 | 7/2016 |

* cited by examiner

Image of suction state of component (A)

Image of mounted state of component (A)

Two-image display

Overlay display

Image of suction state of component (B)

Image of mounted state of component (B)

Two-image display

Overlay display

MANUFACTURING MANAGEMENT SYSTEM FOR COMPONENT MOUNTING LINE

TECHNICAL FIELD

The present description discloses a technique related to a manufacturing management system for a component mounting line including a component mounter and an inspection machine.

BACKGROUND ART

In a component mounting line for producing a component mounting board, as described in Patent Literature 1 (Pamphlet of International Publication No. WO2014/068664), an inspection machine is disposed in the middle or at the downstream end of the component mounting line in which the multiple component mounters are arranged, and the inspection machine inspects the mounted state of a component (deviation of mounting position of the component or absence of the component) mounted on a board by respective component mounters. Conventionally, the inspection machine uses an inspection camera to image the mounted state of each component on the board conveyed out from the component mounter, processes the image of the mounted state of the component to recognize the mounted state of each component, and inspects whether there is a mounting error for each component (inspection pass/fail) based on the recognition result.

On the other hand, the component mounter uses an component imaging camera to image, from below, the suction state of a component picked up by a suction nozzle, processes the image to measure deviations of a suction position and an angle of the component, and corrects the deviations of the suction position and the angle when mounting the component on the board; and in addition, in order to investigate a cause of an occurrence of an error such as a mounting error, the component mounter stores the images of the suction states of the components imaged by the component imaging camera in a storage device linked to production information (traceability information such as the component mounter that mounted the component, mounting time, mounting position, and board identification information) related to the components.

PATENT LITERATURES

Patent Literature 1: International Publication WO2014/068664

BRIEF SUMMARY

Technical Problem

Conventionally, in a case where the inspection machine detects that there is a mounting error for any component mounted on the board, in order to investigate the cause thereof, an operator checks an image of a mounted state of the component imaged by the inspection machine via a display monitor of the inspection machine to confirm whether there is a problem such as erroneous recognition or the like in an inspection result, and if there is no problem such as erroneous recognition or the like in the inspection result, it is considered that the cause of the mounting error is on the component mounter side, thus the operator checks an image of a suction state of the component imaged by the component mounter via the display monitor of the component mounter to confirm whether there is a problem such as erroneous recognition or the like in the recognition result. When confirming the image of the suction state of the component imaged by the component mounter, the operator acquires, from the inspection machine, inspection information (inspection result, component type, inspection time, mounting position, board identification information, or the like) related to the component for which a mounting error was determined to have occurred by the inspection machine, selects the image of the suction state of the component for which a mounting error was determined to have occurred from images of suction states of components stored in the storage device based on the production information and the inspection information related to the component, displays the image on the display monitor of the component mounter, and confirms the suction state of the component for which a mounting error was determined to have occurred.

As described above, in a case where a mounting error of any component on the board is detected by the inspection machine, the operator needs to check the image of the mounted state of the component on the inspection machine side to confirm whether there is no problem such as erroneous recognition in the inspection result, and then check the image of the suction state of the component on the component mounter side to confirm whether there is a problem such as erroneous recognition in the recognition result, which takes time and labor to confirm both images. In addition, in a case where a mounting error of a component on the board is detected by the inspection machine, although there is a possibility that either the inspection machine or the component mounter has erroneously recognized the state of the component, when an image of a mounted state of a component and an image of a suction state of a component are separately confirmed, it may be difficult to confirm which of the inspection machine and the component mounter erroneously recognized the state of the component.

Solution to Problem

In order to solve the above-mentioned problems, there is provided a manufacturing management system for a component mounting line, including: a component mounter configured to mount components on a board, the component mounter imaging suction states of the components picked up by a suction nozzle using a component imaging camera, processing images of the suction states of the components to recognize the suction state of the component, and storing the images in a storage device linked to production information (traceability information such as the component mounter which mounts the component, component type, mounting time, mounting position, and board identification information) related to the components; an inspection machine configured to inspect the mounted state of each component on the board conveyed out from the component mounter, the inspection machine using an inspection camera to image the mounted state of each component on the board conveyed out from the component mounter, processing an image of the mounted state of each component to recognize the mounted state of each component, and inspecting whether a mounting error has occurred for each component based on the recognition result;

an image searching section configured to, when the inspection machine determines that a mounting error occurred for one of the components (inspection failed), search for the image of the suction state of the component for which a mounting error is determined to have occurred, from the images stored in the storage device, based on the production information and inspection information (inspection result, component type, inspection time, mounting position, board identification information, or the like) related to the component; and a display device configured to display the image of the mounted state of the component for which a mounting error is determined to have occurred by the inspection machine, and the image of the suction state of the component searched by the image searching section, in a comparative manner.

In this configuration, when a mounting error is determined to have occurred for any component on a board by the inspection machine, an image obtained by imaging the suction state of the component for which the mounting error is determined to have occurred, is searched based on the production information related to the component by the image searching section from the images stored in the storage device or the like, and the image of the mounted state of the component for which the mounting error is determined to have occurred by the inspection machine and the image of the suction state of the component searched by the image searching section are displayed on the display devices in a comparative manner; accordingly, when a mounting error is determined to have occurred for any component on the board by the inspection machine, the operator does not select the image of the suction state of the component for which the mounting error is determined to have occurred from a large number of stored images, and the image of the mounted state of the component for which the mounting error is determined to have occurred and the image of the suction state of the component can be automatically displayed on one display device in a comparative manner to allow the operator to see the comparison display of the two; and therefore, the confirmation of the inspection result of the inspection machine and the confirmation of the recognition result of the component mounter can be performed efficiently. Moreover, in a case where either inspection machine or component mounter erroneously recognizes the state of the component, by displaying the image of the mounted state of the component for which the mounting error is determined to have occurred and the image of the suction state of the component in a comparative manner, there is an advantage that it becomes easy to understand which of inspection machine and component mounter erroneously recognizes the state of the component.

Here, in a case where the inspection machine inspects a mounted state of each component on the board on which the components are mounted by multiple component mounters, when the inspection machine determines that a mounting error has occurred for any of the components mounted on the board, the image searching section may specify the component mounter that mounted the component for which the mounting error was determined to have occurred based on the production information and the inspection information related to the component, and search for the image with the suction state of the component for which the mounting error was determined to have occurred from the images stored in the storage device in which the images of the suction states of the components of the specified component mounter are stored.

In this case, each of the multiple component mounters may be provided with one storage device, and the storage device may be connected to the multiple component mounters via a network, associate the image of the suction state of the component transmitted from each of the multiple component mounters with the production information related to the component, classify the image for each component mounter, and store the image in the storage device.

At least one display monitor of a display monitor of the inspection machine, a display monitor of the component mounter, and a display monitor of a computer such as a production management computer connected thereto via a network may be used as the display device, and a dedicated display device may be separately provided.

Further, data of the images of the suction states of the components stored in the storage device includes a recognition result of an image processing, and on the image of the suction state of the component displayed on the display device, a contour line of the component (external line) recognized by the image processing may be displayed. In this manner, the operator can easily determine whether the recognition result of the image processing of the component mounter was erroneous recognition based on the contour line of the component of the recognition result of the image processing displayed on the image of the suction state of the component.

In addition, a contour line of a component in a correct mounted state may be displayed on the image of the mounted state of the component displayed on the display device. In this manner, the operator can easily determine whether the inspection result of the inspection machine was erroneously recognized based on the contour line of the component in the correct mounted state displayed on the image of the mounted state of the component.

Further, the display device may display the image of the mounted state of the component and the image of the suction state of the component in a comparative manner by matching component display magnifications thereof. In this case, since the display sizes of the components of both images match each other, the comparison of both images becomes easy.

The display device may display the image of the mounted state of the component and the image of the suction state of the component horizontally or vertically arranged in a comparative manner, and the display device may display the image of the mounted state of the component and the image of the suction state of the component superimposed in a comparative manner.

Alternatively, the display device may be configured so as to allow an operator to switch between a two-image display in which the image of the mounted state of the component and the image of the suction state of the component are displayed horizontally or vertically arranged in a comparative manner, and an overlay display in which the image of the mounted state of the component and the image of the suction state of the component are displayed superimposed in a comparative manner.

Note that, since the component imaging camera images the suction state of the component picked up by the suction nozzle from below, the image of the suction state of the component captured by component imaging camera is an image viewed from a lower face side of the component. On the other hand, since the inspection camera images the mounted state of each component of the board from above, the image of the mounted state of the component captured by inspection camera is an image viewed from an upper face side of the component. Therefore, the image of the mounted state of the component and the image of the suction state of the component are different in XY-directions. Therefore, either one of the images is reversed and rotated so that the XY-directions of the image in the mounted state of the component matches the XY-directions of the image in the suction state of the component with reference to an XY-coordinate system of the component mounter, and the display device both may display both images in a comparative manner. This makes it easier to compare the image of the mounted state and the image of the suction state.

In general, when a recognition angle of the component recognized by processing the image of the suction state of the component and a correct mounting angle of the component are different from each other, the component mounter rotationally corrects the angle of the component picked up by the suction nozzle by the angle difference between the recognition angle and the correct mounting angle, and mounts the component on the board. In consideration of this point, the display device may reverse and rotate one of the images so as to match the correct mounting angle of the component in the image of the mounted state of the component and the recognition angle of the component in the image of the suction state of the component, and may display both images in a comparative manner. By doing so, even when the angle of the component picked up by the suction nozzle is rotationally corrected and mounted on the board, the comparison between both images becomes easier.

The inspection machine may store images of the mounted states of the components imaged by the inspection camera in an inspection information storage section linked the inspection information related to the components, an operator may be allowed to select the image of the mounted state of the component to be displayed on the display device from the images stored in the inspection information storage section, when the operator selects the image of the mounted state of the component to be displayed on the display device, the image searching section may search for the image, imaging the suction state of the component that the operator selected from the images stored in the storage device based on the production information and the inspection information related to the components, and the display device may display the image of the mounted state of the component that the operator selects and the image of the suction state of the component that the image searching section searched for in a comparative manner. In this manner, the operator can freely select an image to be displayed on the display device, and the cause of the mounting failure can be investigated in more detail.

DESCRIPTION OF EMBODIMENTS

Figure 1:
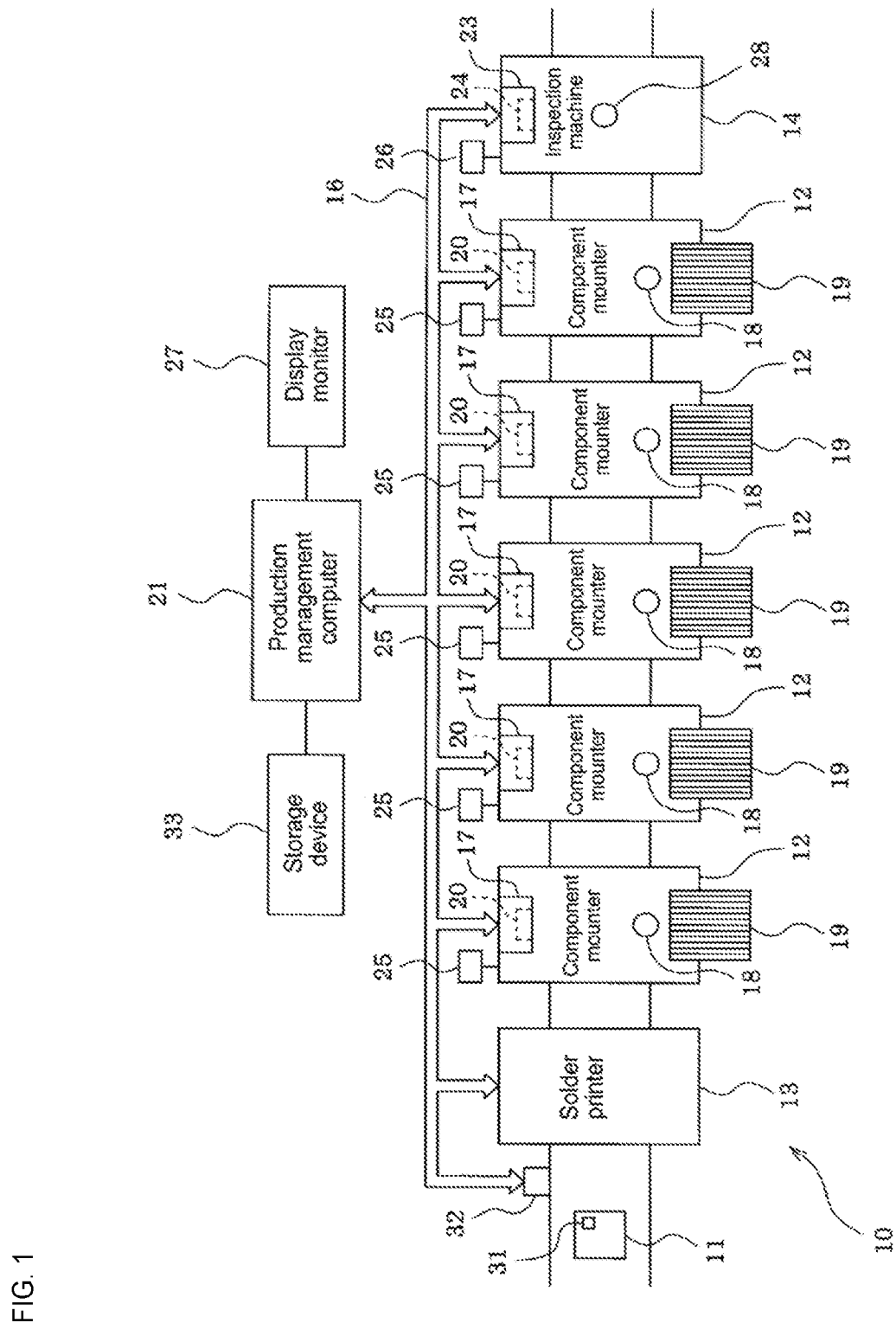
FIG. 1 is a block diagram schematically showing a configuration of a manufacturing management system of a component mounting line according to an embodiment.

Hereinafter, an embodiment will be described with reference to the drawings. First, the configuration of component mounting line 10 will be described with reference to FIG. 1.

In component mounting line 10, one or multiple component mounters 12, mounting related devices such as solder printer 13 and a flux coating device (not shown), and inspection machine 14 for inspecting whether the mounted state of each component mounted on board 11 is good, are arranged along a conveyance direction of board 11. The number of inspection machines 14 to be installed in component mounting line 10 is not limited to one, and may be multiple; and some of the inspection machines may be installed between component mounters 12 in the middle of component mounting line 10.

Component mounter 12, solder printer 13, and inspection machine 14 of component mounting line 10 are connected to production management computer 21 via network 16 so as to be able to communicate with production management computer 21, and the production of component mounting line 10 is managed by production management computer 21.

Board ID recording section 31 (board identification information recording section) that records and stores board identification information (hereinafter referred to as "board ID") is provided outside a component mounting region on an upper face of board 11. Board ID recording section 31 may record a code such as a bar code or a two-dimensional code, or may use an electronic tag (also referred to as an RF tag, a wireless tag, an IC tag, an electromagnetic wave tag, or the like) for electronic storage, a magnetic tape for magnetic recording, or the like.

On the other hand, on the board loading side of conveyance of component mounting line 10, reader 32 is provided as a board identification information reading device for reading the board ID recorded and stored in board ID recording section 31.

Production management computer 21 that manages production of component mounting line 10 reads the board ID of board 11 from board ID recording section 31 conveyed into component mounting line 10 by reader 32 disposed on the board loading side of component mounting line 10, transmits the read board ID to each component mounter 12 and inspection machine 14, and notifies each component mounter 12 and inspection machine 14 of the board ID of the board 11 to be conveyed. As a result, control device 17 of each component mounter 12 and control device 23 of inspection machine 14 recognize the board ID of board 11 conveyed into each component mounter 12 and inspection machine 14 by making the order of board 11 to be conveyed into correspond to the order of the board ID read by reader 32 from the first board 11.

Alternatively, when board 11 on which the component is mounted by each component mounter 12 is conveyed to component mounter 12 or inspection machine 14 on the downstream side, the board ID of board 11 may be transmitted from each component mounter 12 to component mounter 12 or inspection machine 14 on the downstream side thereby recognizing the board ID of board 11 conveyed into each component mounter 12 or inspection machine 14.

Control device 17 of each component mounter 12 mounts a predetermined number of components on board 11 by repeating the following operation according to a production job transmitted from production management computer 21, the operation including moving a mounting head (not shown) along a path from a component pickup position to a component imaging position to a component mounting position, picking up the component supplied from feeder 19 by a suction nozzle (not shown) of the mounting head, imaging the component by component imaging camera 18, processing the captured image by an image processing function of control device 17, recognizing the suction state (positions X and Y and angle θ) of the component, correcting deviations of the positions X and Y and the angle θ of the component, and mounting the component on board 11.

Further, control device 17 of each component mounter 12 stores the images of the suction states of the components imaged by component imaging camera 18 in storage device 20 linked to the production information (traceability information such as component mounter 12 which mounts the component, component type, mounting time, mounting position, and board ID) related to the components. Storage device 20 has a storage capacity capable of storing the number of images necessary for a cause investigation at the time of abnormality occurrence of component mounter 12, and is configured by a rewritable non-volatile storage medium (a hard disk device or the like) which holds stored data even in a power-off state. When the number of stored images in storage device 20 exceeds a predetermined number or a predetermined memory capacity, the oldest stored image is automatically deleted and the latest image is stored.

The images of the suction states of the components imaged by component imaging camera 18 are transmitted from control device 17 of component mounter 12 to production management computer 21 linked to the production information related to the components, and data thereof may be classified for each component mounter 12 and stored in storage device 33 of production management computer 21. Alternatively, the images of the suction states of the components may be classified for each component mounter 12 and stored in an external storage (not shown) such as an image storage server connected to component mounting line 10 via network 16 with linking production information related to the component.

The component mounting board produced by sequentially passing through each component mounter 12 of component mounting line 10 is conveyed into inspection machine 14. Control device 23 of inspection machine 14 has an image processing function, and images the mounted state of each component of conveyed board 11 by inspection camera 28, processes the captured image, recognizes the mounted state of each component on board 11, and inspects whether a mounting error occurred for each component (inspection failed) based on the recognition result.

Further, control device 23 of inspection machine 14 stores the images of the mounted states of the components imaged by inspection camera 28 in storage device 24 (inspection information storage section) linked to inspection information (component type, inspection time, mounting position, board ID, and the like) related to the component. Storage device 24 has a storage capacity capable of storing the number of images necessary for a cause investigation at the time of abnormality occurrence of component mounter 12, and is configured by a rewritable non-volatile storage medium (a hard disk device or the like) which holds stored data even in a power-off state. When the number of stored images in storage device 24 exceeds a predetermined number or a predetermined memory capacity, the oldest stored image is automatically deleted and the latest image is stored.

The images of the mounted states of the inspected components may be transmitted from control device 23 of inspection machine 14 to production management computer 21 linked to the inspection information related to the components, and data thereof may be stored in storage device 33 of production management computer 21. Alternatively, the images of the mounted states of the components may be stored in an external storage (not shown) such as an image storage server connected to component mounting line 10 via network 16 linked to inspection information related to the component.

Each component mounter 12 is provided with display monitor 25 (display device), and inspection machine 14 is also provided with display monitor 26 (display device). Production management computer 21 is also provided with display monitor 27 (display device).

When control device 17 of each component mounter 12 stores the images of the suction states of the components imaged by component imaging camera 18 in storage device 20 linked to the production information (traceability information such as component mounter 12 which mounts the component, component type, mounting time, mounting position, and board ID) related to the components, control device 17 transmits the production information related to the component to production management computer 21 and/or inspection machine 14. When inspection machine 14 detects a mounting error for any component on board 11, control device 23 of inspection machine 14 transmits the inspection information (inspection result, component type, inspection time, mounting position, board ID, and the like) related to the component to production management computer 21. Thereby, production management computer 21 specifies component mounter 12 which mounted the component for which the mounting error was determined to have occurred by comparing the inspection information received from inspection machine 14 with the production information received from each component mounter 12, and searches for and acquires the image, imaging the suction state of the component for which the mounting error was determined to have occurred, from the images stored in the storage device 20 of specified component mounter 12. Similarly, control device 23 of inspection machine 14 may specify component mounter 12 which mounted the component for which the mounting error was determined to have occurred by comparing the inspection information related to the component for which the mounting error was determined to have occurred with the production information received from each component mounter 12, and may search for and acquire the image, imaging the suction state of the component for which the mounting error was determined to have occurred from the images stored in storage device 20 of specified component mounter 12.

Figure 10:
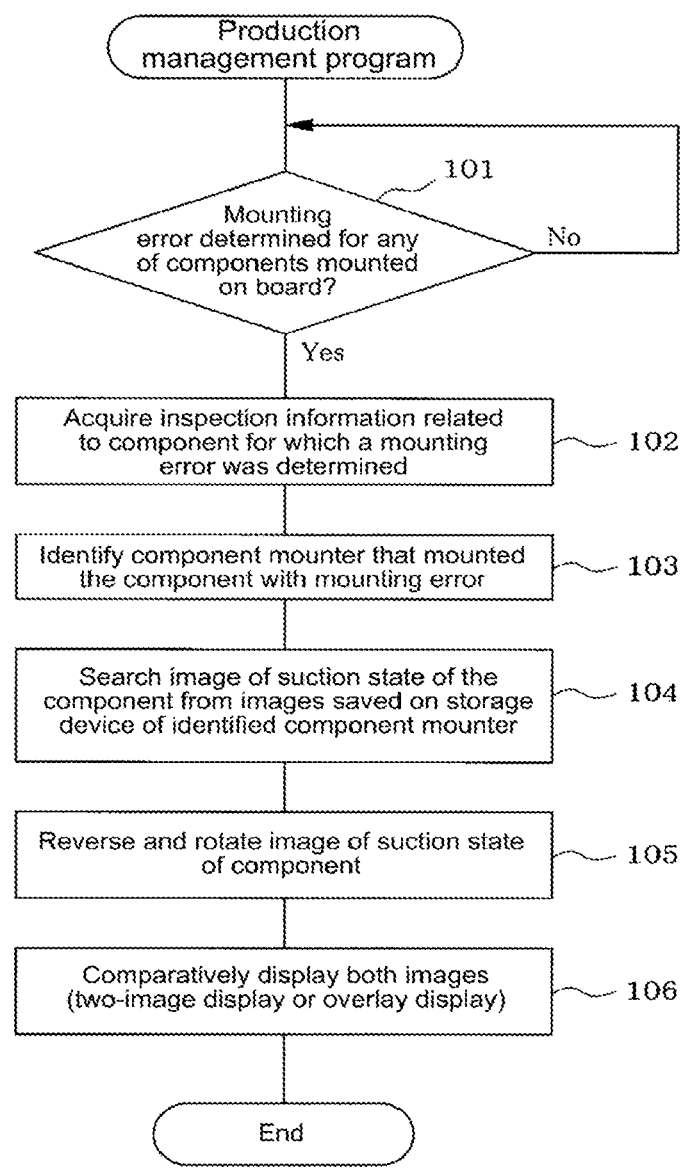
FIG. 10 is a flowchart showing a flow of processes of a production management program.

Production management computer 21 or control device 23 of inspection machine 14 executes a production management program of FIG. 10, which will be described later, so that when inspection machine 14 detects a mounting error of any component on board 11, the inspection information related to the component for which the mounting error was determined to have occurred is compared with the production information received from each component mounter 12, thereby specifying component mounter 12 which mounted the component for which the mounting error was determined to have occurred, and functions as an "image searching section" which searches for an image, imaging the suction state of the component for which the mounting error was determined to have occurred from the images stored in storage device 20 of specified component mounter 12, and displays the image of the mounted state of the component for which the mounting error was determined to have occurred and the image of the suction state of the searched component on display monitor 27 of production management computer 21 or display monitor 26 of inspection machine 14 in a comparative manner. Alternatively, both images may be displayed, in a comparative manner, on display monitor 25 of component mounter 12 which mounted the component for which the mounting error was determined to have occurred.

In the present embodiment, the data of the images of the suction states of the components stored in storage device 20 includes a recognition result of the image processing, and a contour line (external line) of the component recognized by the image processing is displayed on the image of the suction state of the component displayed on any of the display monitors 25 to 27 as shown in FIGS. 2, 4 to 6, 8, and 9. In this manner, if the contour line of the component recognized by the image processing is displayed on the image of the suction state of the component, it is possible for the operator to easily determine whether the recognition result of the image processing of component mounter 12 was erroneous recognition. FIGS. 2 to 5 are display examples of images of the same component (A), and FIGS. 6 to 9 are display examples of images of the same component (B).

Further, as shown in FIGS. 3 to 5 and 7 to 9, the contour line of the component in the correct mounted state is displayed on the image of the mounted state of the component displayed on any of the display monitors 25 to 27. In this manner, the operator can easily determine whether the inspection result of inspection machine 14 was erroneously recognized based on the contour line of the component in the correct mounted state displayed on the image of the mounted state of the component.

Further, the component display magnifications (display size of the component) for the image of the suction state of the component and the image of the mounted state of the component match each other to be displayed on any of the display monitors 25 to 27 in a comparative manner.

Figure 4:
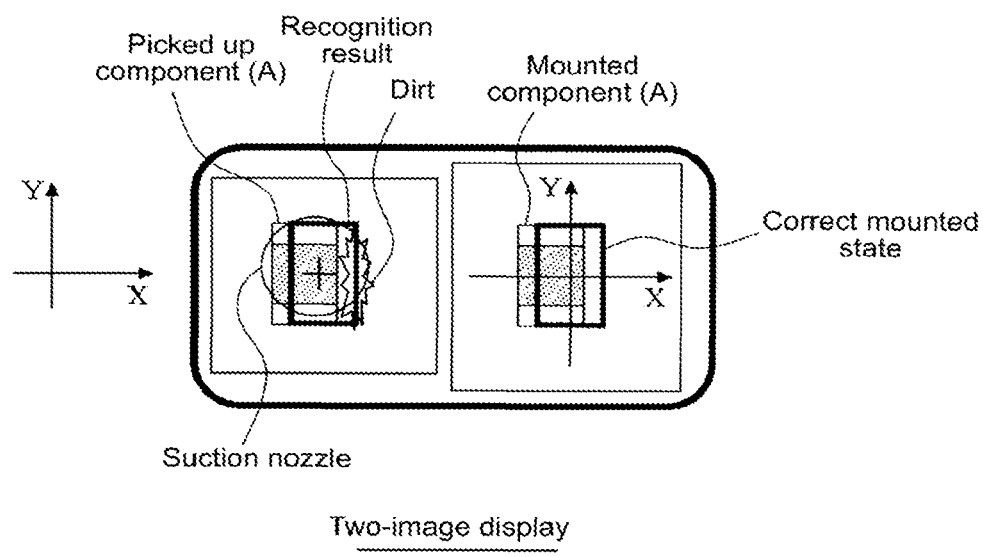
FIG. 4 is a diagram showing a two-image display in which an image of a suction state of component (A) and an image of a mounted state of component (A) are displayed horizontally or vertically arranged in a comparative manner.
Figure 5:
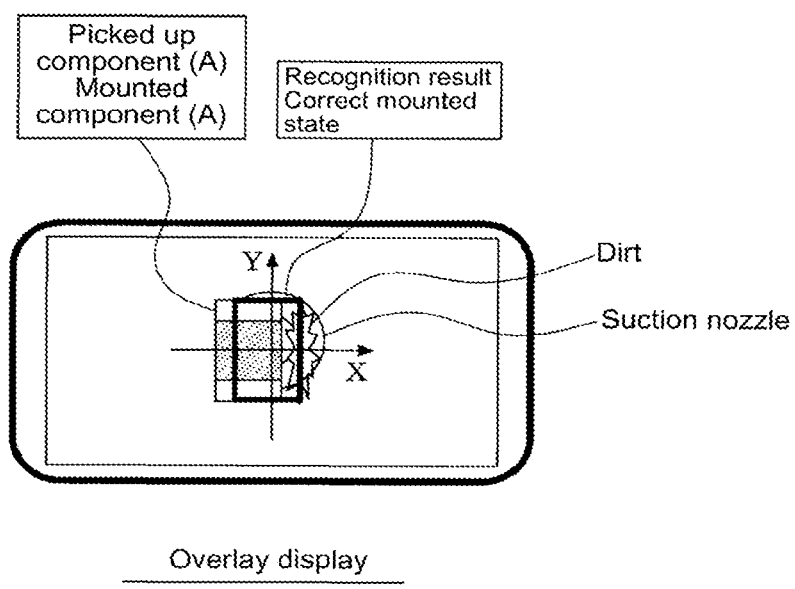
FIG. 5 is a diagram showing an overlay display in which the image of the suction state of component (A) and the image of the mounted state of component (A) are displayed superimposed in a comparative manner.
Figure 8:
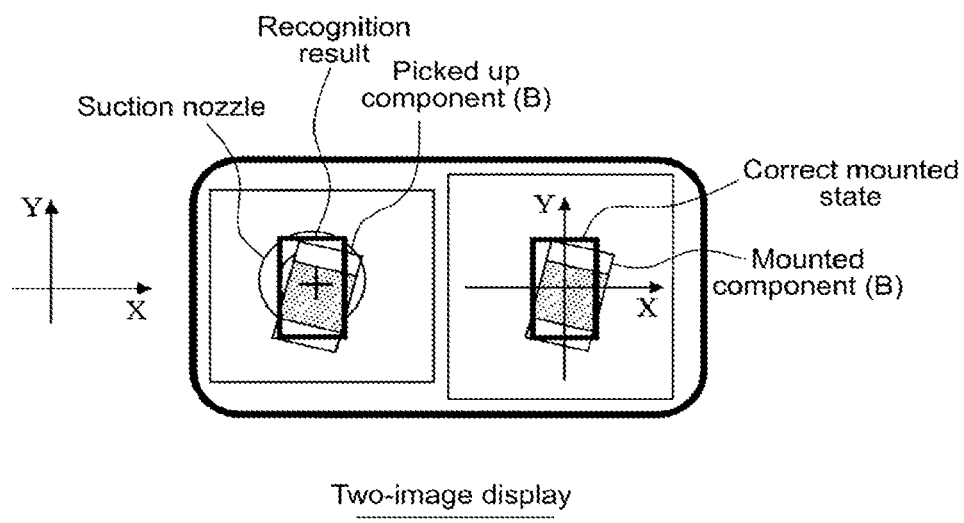
FIG. 8 is a diagram showing a two-image display in which the image of the suction state of component (B) and the image of the mounted state of component (B) are displayed horizontally arranged in a comparative manner.
Figure 9:
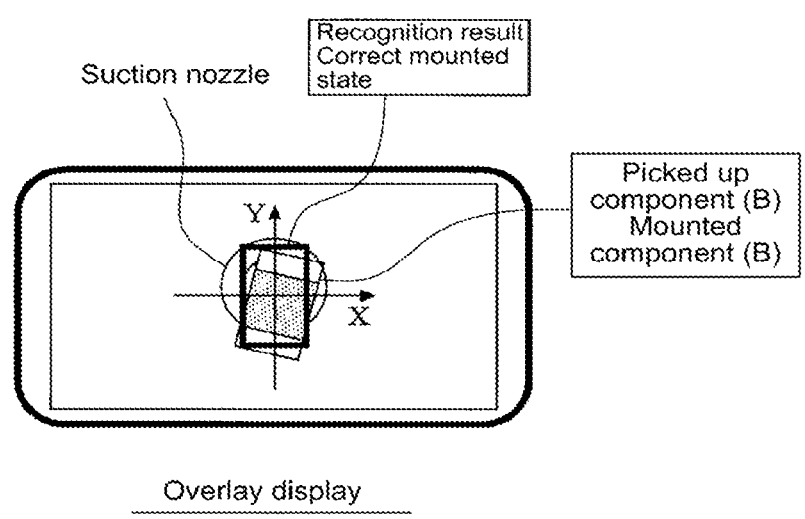
FIG. 9 is a diagram showing an overlay display in which the image of the suction state of the component (B) and the image of the mounted state of the component (B) are displayed superimposed in a comparative manner.

Here, as a mode of display of both images in a comparative manner, as shown in FIGS. 4 and 8, the image of the mounted state of the component and the image of the suction state of the component may be displayed horizontally or vertically arranged in a comparative manner, or as shown in FIGS. 5 and 9, the image of the mounted state of the component and the image of the suction state of the component may be displayed superimposed in a comparative manner.

Further, in the present embodiment, the operator can switch between a two-image display in which the image of the mounted state of the component and the image of the suction state of the component are displayed horizontally or vertically arranged in a comparative manner, and an overlay display in which the image of the mounted state of the component and the image of the suction state of the component are displayed superimposed in a comparative manner.

Figure 2:
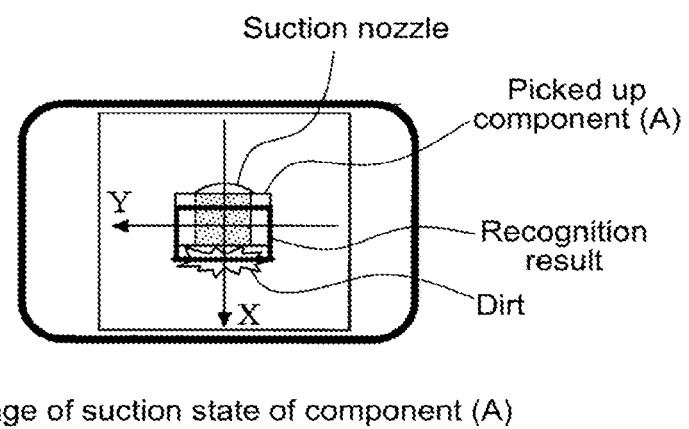
FIG. 2 is a diagram showing an image of a suction state of component (A) displayed on a display monitor of a component mounter.
Figure 3:
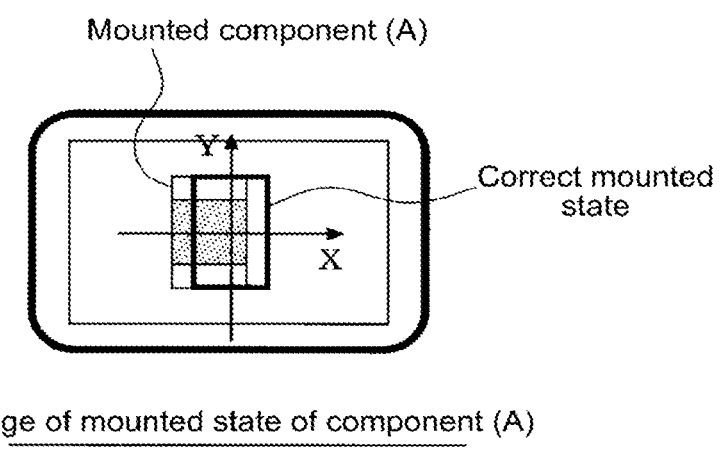
FIG. 3 is a diagram showing an image of a mounted state of component (A) displayed on a display monitor of an inspection machine.
Figure 6:
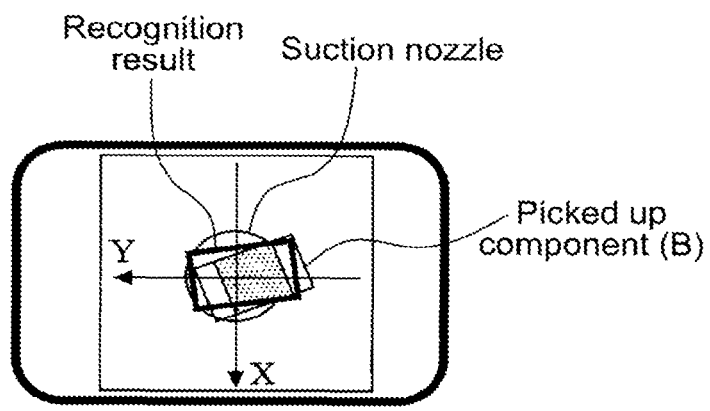
FIG. 6 is a diagram showing an image of a suction state of component (B) displayed on the display monitor of the component mounter.
Figure 7:
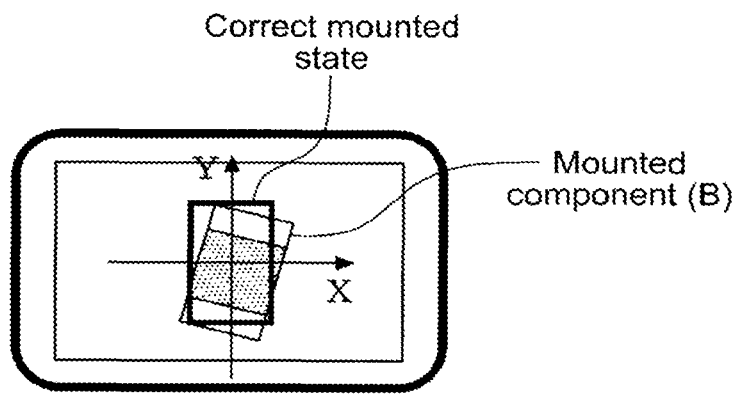
FIG. 7 is a diagram showing an image of a mounted state of component (B) displayed on the display monitor of the inspection machine.

Since component imaging camera 18 of component mounter 12 images the suction state of the component picked up by the suction nozzle from below, the image of the suction state of the component captured by component imaging camera 18 is an image viewed from a lower face side of the component (see FIGS. 2 and 6). On the other hand, since inspection camera 28 of inspection machine 14 images the mounted state of each component of board 11 from above, the image of the mounted state of the component captured by inspection camera 28 is an image viewed from an upper face side of the component (see FIGS. 3 and 7). Therefore, the image of the mounted state of the component and the image of the suction state of the component are different in XY-directions.

Therefore, in the present embodiment, as shown in FIGS. 4 and 5, either one of the images is reversed and rotated so that the XY-directions of the image in the mounted state of the component matches the XY-directions of the image in the suction state of the component with reference to an XY-coordinate system of component mounter 12, and both images are displayed in a comparative manner. In the display examples of FIGS. 4 and 5, the images of the suction state of the component are reversed.

In general, when the recognition angle of the component recognized by processing the image of the suction state of the component and the correct mounting angle of the component are different from each other, component mounter 12 rotationally corrects the angle of the component picked up by the suction nozzle by the angle difference between the recognition angle and the correct mounting angle, and mounts the component on board 11.

In consideration of this point, in the present embodiment, when the recognition angle of the component recognized by processing the image of the suction state of the component and the correct mounting angle of the component are different from each other, as shown in FIGS. 8 and 9, either one of the images is reversed and rotated so that the recognition angle of the component in the image of the suction state of the component matches the correct mounting angle of the component in the image of the mounted state of the component, and both images are displayed in a comparative manner. By doing so, even when the angle of the component picked up by the suction nozzle is rotationally corrected and mounted on board 11, the comparison between both images becomes easier. In the display examples of FIGS. 8 and 9, the images of the suction state of the component are reversed.

Further, in the present embodiment, the operator can select the image of the mounted state of the component displayed on any of the display monitors 25 to 27 from the images of the mounted states of the components stored in storage device 33 of production management computer 21 or storage device 24 of inspection machine 14; and when the operator selects the image of the mounted state of the component displayed on any of the display monitors 25 to 27, production management computer 21, control device 23 of inspection machine 14, or control device 17 of component mounter 12 searches for an image of a suction state of a component selected by the operator from the images stored in storage device 20 or 33 or the like based on the production information and the inspection information of the component, and displays the image of the mounted state of the component selected by the operator and the searched image of the suction state of the component on any of the display monitors 25 to 27 in a comparative manner. In this manner, the operator can freely select an image to be displayed on any of the display monitors 25 to 27, and the cause of the mounting failure can be investigated in more detail.

Next, processes of the production management program of FIG. 10 executed by production management computer 21 or control device 23 of inspection machine 14 will be described. The production management program of FIG. 10 is executed during production. When the program is started, first, in step 101, it is determined whether inspection machine 14 detects a mounting error of any of the components on board 11, and the process waits until a mounting error of any of the components is detected. Thereafter, when a mounting error of any of the components is detected, the process proceeds to step 102, and inspection information regarding the component for which a mounting error was determined to have occurred is acquired.

Thereafter, the process proceeds to step 103 to compare the inspection information related to the component for which a mounting error was determined to have occurred with the production information received from each component mounter 12, thereby specifying component mounter 12 which mounted the component for which a mounting error was determined to have occurred. Then, in the next step 104, an image, being obtained by imaging the suction state of the component for which a mounting error was determined to have occurred, is searched from the images stored in storage device 20 or the like of specified component mounter 12. The processes of these steps 102 to 104 serves as an "image searching section".

Thereafter, the process proceeds to step 105, and as shown in FIGS. 4 and 5, either one of the images, for example, the image of the suction state of the component is reversed and rotated so that the XY-directions of the image if the mounted state of the component matches with the XY-directions of the image of the suction state of the component with reference to the XY-coordinate system of component mounter 12. At this time, when the recognition angle of the component recognized by processing the image of the suction state of the component and the correct mounting angle of the component are different from each other, as shown in FIGS. 8 and 9, one of the images, for example, the image of the suction state of the component is reversed and rotated so that the recognition angle of the component in the image of the suction state of the component matches the correct mounting angle of the component in the image of the mounted state of the component.

Then, in the next step 106, the image of the mounted state of the component for which a mounting error was determined to have occurred and the image of the suction state of the component are displayed on display monitor 27 of production management computer 21 or display monitor 26 of inspection machine 14 in a comparative manner. Alternatively, both images may be displayed, in a comparative manner, on display monitor 25 of component mounter 12 which mounted the component for which a mounting error was determined to have occurred. The comparative display of both images may be any of a two-image display, as shown in FIG. 4 FIG. 8, in which the image of the mounted state of the component and the image of the suction state of the component are displayed horizontally or vertically arranged in a comparative manner, or may be an overlay display, as shown in FIGS. 5 and 9, in which the image of the mounted state of the component and the image of the suction state of the component are displayed superimposed in a comparative manner.

According to the present embodiment described above, when inspection machine 14 determines that a mounting error occurred for any component on board 11, an image, being obtained by imaging the suction state of the component for which a mounting error was determined to have occurred, is searched based on the production information related to the component from the images stored in the storage device 20 or 33 or the like, and the image of the mounted state of the component for which a mounting error was determined to have occurred by inspection machine 14 and the searched image of the suction state of the component are displayed on the display monitors 25 to 27 in a comparative manner accordingly, when inspection machine 14 determines that a mounting error has occurred for any component on board 11, the operator does not select the image of the suction state of the component determined to have failed to be mounted from a large number of stored images, and the image of the mounted state of the component for which a mounting error was determined to have occurred and the image of the suction state of the component can be automatically displayed on any of the display monitors 25 to 27 in a comparative manner to allow the operator to check the comparison display of the two; and therefore, the confirmation of the inspection result of inspection machine 14 and the confirmation of the recognition result of component mounter 12 can be performed efficiently.

Moreover, in a case where either inspection machine 14 or component mounter 12 erroneously recognizes the state of the component, by displaying the image of the mounted state of the component determined to have failed to be mounted and the image of the suction state of the component in a comparative manner, there is an advantage that it becomes easy to understand which of inspection machine 14 and component mounter 12 erroneously recognized the state of the component.

The present disclosure is not limited to above-mentioned embodiments, and it is needless to state that the present disclosure can be implemented by various modifications within a range that does not deviate from the gist, for example, the configuration of component mounting line 10 may be changed.

REFERENCE SIGNS LIST

10 . . . component mounting line, 11 . . . board, 12 . . . component mounter, 14 . . . inspection machine, 17 . . . control device of component mounter, 18 . . . component imaging camera, 20 . . . storage device, 21 . . . production management computer (image searching section), 23 . . . control device of inspection machine (image searching section), 24 . . . storage device, 25 to 27 . . . display monitor (display device), 28 . . . inspection camera, 31 . . . board ID recording section (board identification information recording section), 32 . . . reader (board identification information reading device), 33 . . . storage device

The invention claimed is:

1. A manufacturing management system for a component mounting line, comprising:
   a component mounter configured to mount components on a board, the component mounter imaging suction states of the components picked up by a suction nozzle using a component imaging camera, processing images of the suction states of the components to recognize the suction state of the component, and storing the images in a storage device linked to production information related to the components;
   an inspection machine configured to inspect the mounted state of each component on the board conveyed out from the component mounter, the inspection machine using an inspection camera to image the mounted state of each component on the board conveyed out from the component mounter, processing an image of the mounted state of each component to recognize the mounted state of each component, and inspecting whether a mounting error has occurred for each component based on the recognition result;

an image searching section configured to, when the inspection machine determines that a mounting error occurred for one of the components, search for the image, being obtained by imaging the suction state of the component and for which a mounting error is determined to have occurred, from the images stored in the storage device, based on the production information and inspection information related to the component; and a display device configured to display the image of the mounted state of the component for which a mounting error is determined to have occurred by the inspection machine, and the image of the suction state of the component searched by the image searching section, in a comparative manner.

2. The manufacturing management system of a component mounting line according to claim 1, wherein the inspection machine is configured to inspect a mounted state of each component on the board on which the components are mounted by multiple component mounters, and the image searching section is configured to, when the inspection machine has determined that a mounting error has occurred for one the components, specify the component mounter that mounted the component for which the mounting error was determined to have occurred based on the production information and the inspection information related to the component, and search for the image with the suction state of the component for which the mounting error was determined to have occurred from the images stored in the storage device in which the images of the suction states of the components of the specified component mounter are stored.

3. The manufacturing management system of a component mounting line according to claim 2, wherein each of the multiple component mounters is provided with one storage device.

4. The manufacturing management system of a component mounting line according to claim 2, wherein the storage device is connected to the multiple component mounters via a network and is configured to associate the image of the suction state of the component transmitted from each of the multiple component mounters with the production information related to the component, classify the image for each component mounter, and store the image.

5. The manufacturing management system of a component mounting line according to claim 1, wherein at least one display monitor of a display monitor of the inspection machine, a display monitor of the component mounter, and a display monitor of a computer connected thereto via a network is used as the display device.

6. The manufacturing management system of a component mounting line according to claim 1, wherein data of the images of the suction states of the components stored in the storage device includes a recognition result of an image processing, and wherein on the image of the suction state of the component displayed on the display device, a contour line of the component recognized by the image processing is displayed.

7. The manufacturing management system of a component mounting line according to claim 1, wherein a contour line of a component in a correct mounted state is displayed on the image of the mounted state of the component displayed on the display device.

8. The manufacturing management system of a component mounting line according to claim 1, wherein the display device is configured to display the image of the mounted state of the component and the image of the suction state of the component in a comparative manner by matching component display magnifications thereof.

9. The manufacturing management system of a component mounting line according to claim 1, wherein the display device is configured to display the image of the mounted state of the component and the image of the suction state of the component arranged horizontally or vertically in a comparative manner.

10. The manufacturing management system of a component mounting line according to claim 1, wherein the display device is configured to display the image of the mounted state of the component and the image of the suction state of the component superimposed in a comparative manner.

11. The manufacturing management system of a component mounting line according to claim 1, wherein the display device is configured to allow an operator to switch between a two-image display in which the image of the mounted state of the component and the image of the suction state of the component are displayed arranged horizontally or vertically in a comparative manner, and an overlay display in which the image of the mounted state of the component and the image of the suction state of the component are displayed superimposed in a comparative manner.

12. The manufacturing management system of a component mounting line according to claim 1, wherein the component imaging camera is configured to image the suction state of the component picked up by the suction nozzle from below, wherein the inspection camera images the mounted state of each component of the board from above, and wherein the display device reverses and rotates one of the images so as to match XY-directions of the image of the mounted state of the component with XY-directions of the image of the suction state of the component with reference to an XY-coordinate system of the component mounter, thereby displaying both images in a comparative manner.

13. The manufacturing management system of a component mounting line according to claim 1, wherein the component imaging camera is configured to image the suction state of the component picked up by the suction nozzle from below, wherein the inspection camera is configured to image the mounted state of each component of the board from above, wherein, when a recognition angle of the component recognized by processing the image of the suction state of the component and a correct mounting angle of the component are different, the component mounter rotationally corrects an angle of the component picked up by the suction nozzle by an angle difference between the recognition angle and the correct mounting angle to mount the component on the board, and wherein the display device is configured to reverse and rotate one of the images so as to match the correct mounting angle of the component in the image of the mounted state of the component and the recognition angle of the component in the image of the suction state of the component, and display both images in a comparative manner.

14. The manufacturing management system of a component mounting line according to claim 1, wherein the inspection machine is configured to store the images of the mounted states of the components imaged by the inspection camera in an inspection information storage section linked to the inspection information related to the components, wherein an operator is allowed to select the image of the mounted state of the component to be displayed on the display device from the images stored in the inspection information storage section, wherein, when the operator selects the image of the mounted state of the component to be displayed on the display device, the image searching section searches for the image of the suction state of the component that the operator selects from the images stored in the storage device based on the production information and the inspection information related to the components, and wherein the display device is configured to display the image of the mounted state of the component that the operator selected and the image of the suction state of the component that the image searching section searched for in a comparative manner.

* * * * *